Figure 1:
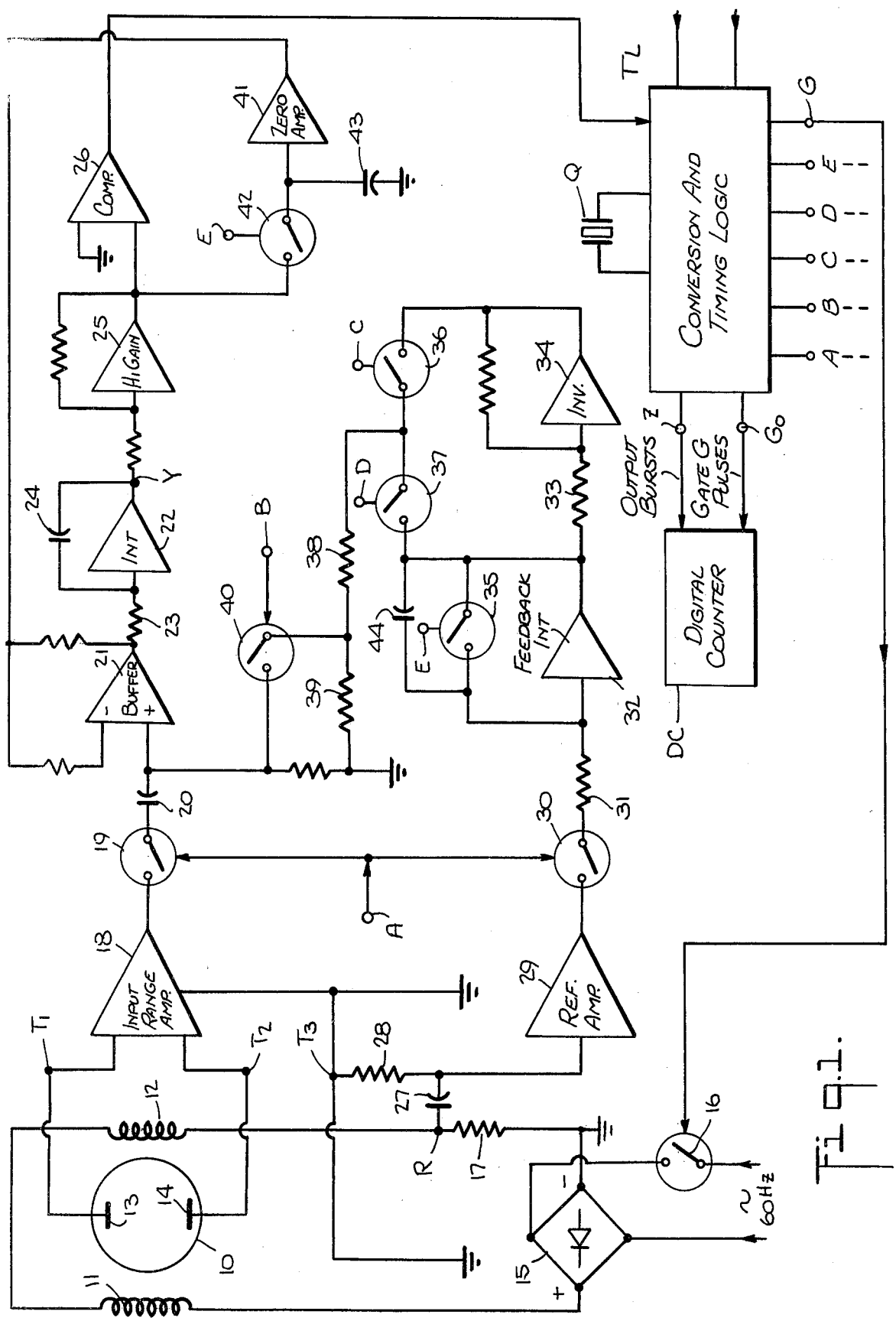

United States Patent [19]

Shauger

[11] 4,339,958
[45] Jul. 20, 1982

[54] ANALOG-TO-DIGITAL CONVERTER FOR ELECTROMAGNETIC FLOWMETER

[75] Inventor: Herbert A. Shauger, Willow Grove, Pa.

[73] Assignee: Fischer & Porter Co., Warminster, Pa.

[21] Appl. No.: 123,431

[22] Filed: Feb. 21, 1980

[51] Int. Cl.³ .................... G01F 1/00; H03K 13/02
[52] U.S. Cl. ........................ 73/861.17; 324/99 D; 340/347 M; 340/347 NT
[58] Field of Search ............... 73/861.17; 340/347 M, 340/347 NT, 347 AD, 347 CC; 324/99 D

[56] References Cited

U.S. PATENT DOCUMENTS 3,783,687  1/1974  Mannherz et al. ............ 73/861.17 X
4,041,484  8/1977  Boleda et al. ............... 340/347 AD X

OTHER PUBLICATIONS

Strong, Product Development Profile-Rough Life of Digital Multimeter Electronics, 23 Jun. 1977, pp. 107-112.
The Engineering Staff of Analog Devices, Inc., Analog-Digital Conversion Handbook, 6/1972, pp. I-33, 34; II-48 to II-50.

Primary Examiner—Thomas J. Sloyan
Attorney, Agent, or Firm—Michael Ebert

[57] ABSTRACT

An analog-to-digital converter for an electromagnetic flowmeter in which the fluid being metered passes through a flow tube to intersect a magnetic field, the voltage induced in the fluid being transferred to a pair of electrodes. The magnetic field is established by an electromagnet supplied with excitation current that is alternately turned "on" and "off" at a low frequency rate. The resultant flow-induced electrode signal is sampled for a predetermined interval in each "on" and "off" field state, successive differences therebetween serving to develop an analog signal representing the flow rate. Conversion is effected by integrating each sample to produce a sloped voltage whose polarity corresponds to that of the sample and whose peak level relative to a base level is determined by the amplitude of the sample, the sloped voltage being then de-integrated back to base level in a time slot whose duration is directly proportional to the average level of the sample. A burst of pulses is extracted from a stable high-frequency oscillator during this time slot, the pulse count of the burst being determined by the duration of the slot, thereby converting each sample to a digital value.

2 Claims, 4 Drawing Figures

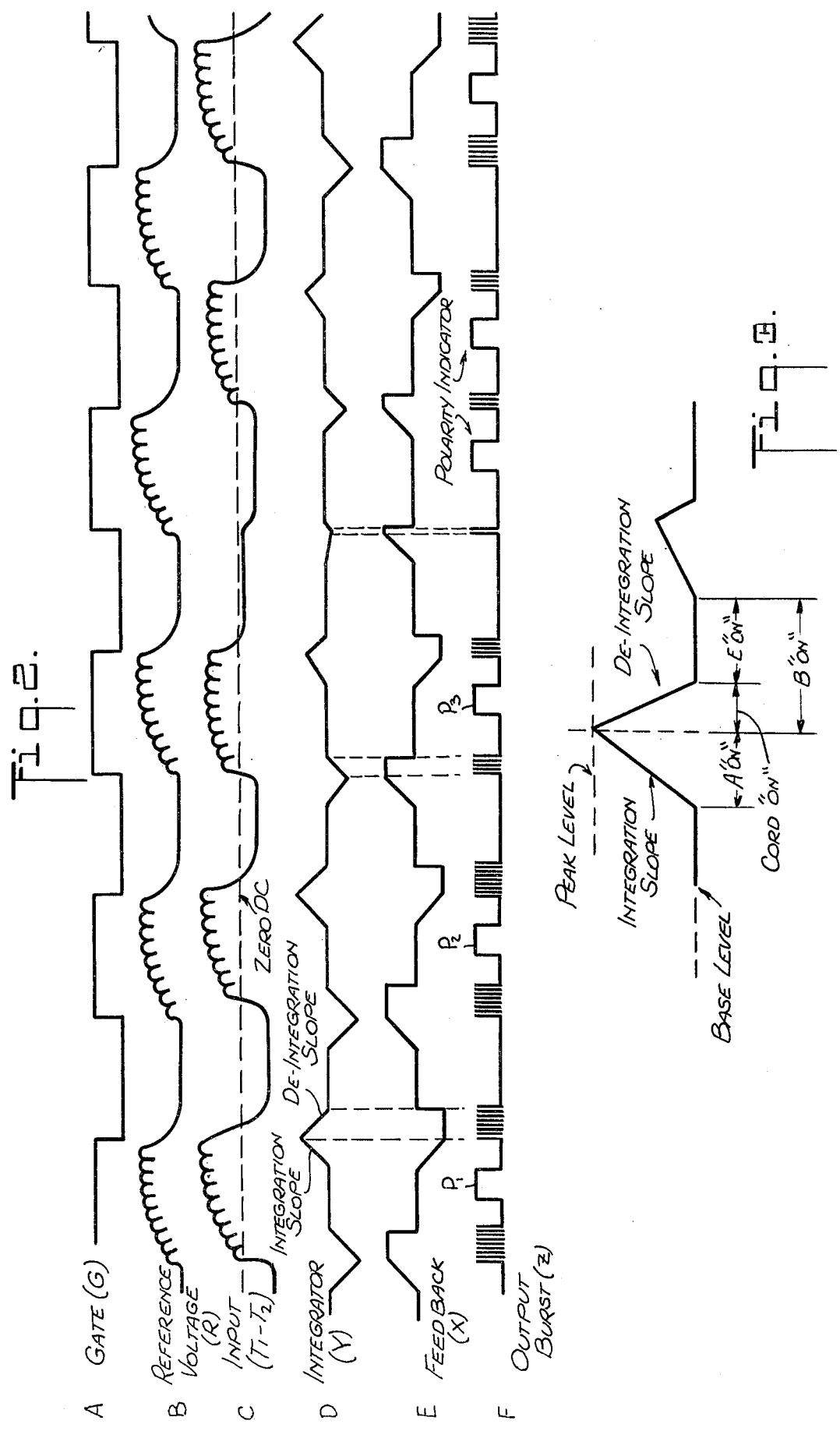

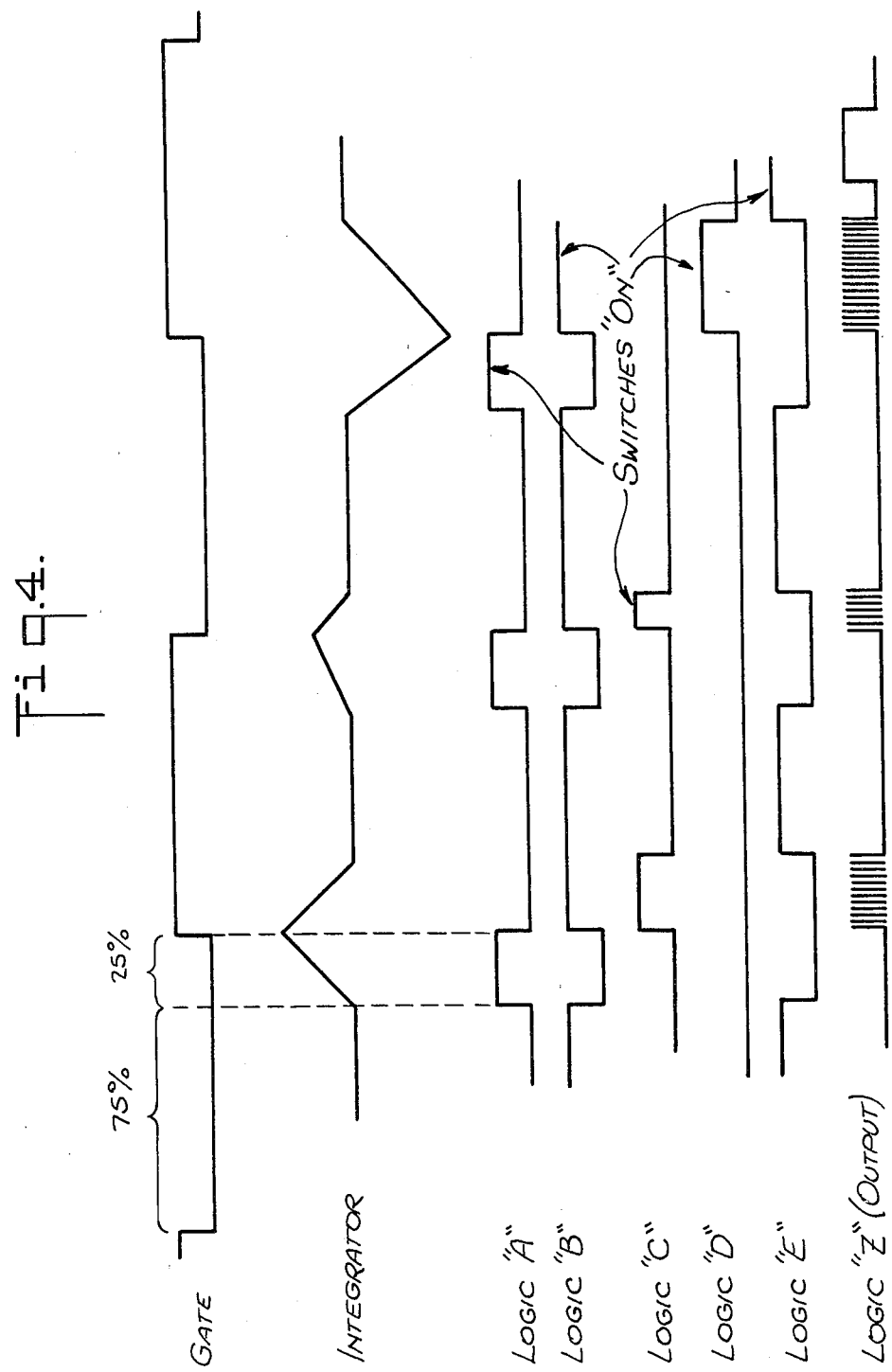

ANALOG-TO-DIGITAL CONVERTER FOR ELECTROMAGNETIC FLOWMETER

BACKGROUND OF INVENTION

This invention relates generally to systems which include an electromagnetic flowmeter whose electromagnet is excited by a pulsatory current having a predetermined drive frequency to produce an analog signal indicative of flow rate, and more particularly to a system in which this analog signal is converted into a digital output representing instantaneous flow values that may be processed by an intelligent digital device such as a microprocessor.

In a conventional electromagnetic flowmeter, the fluid whose flow rate is to be measured is conducted through a flow tube provided with a pair of diametrically-opposed electrodes, a magnetic field perpendicular to the longitudinal axis of the tube being established by an electromagnet. When the fluid intersects this field, a voltage is induced therein which is transferred to the electrodes. This voltage, which is proportional to the average velocity of the fluid and hence to its average volumetric rate, is then amplified and processed to yield an output signal for actuating a recorder or indicator, or for carrying out various process control operations.

The magnetic field may be either direct or alternating in nature; for in either event the amplitude of voltage induced in the liquid passing through the field will be a function of its flow rate. However, when operating with direct magnetic flux, the D-C signal current flowing through the liquid acts to polarize the electrodes, the magnitude of polarization being proportional to the time integral of the polarization current. With alternating magnetic flux operation, polarization is rendered negligible; for the resultant signal current is alternating and therefore its integral does not build up with time.

Though A-C operation is clearly advantageous in that polarization is obviated and the A-C flow-induced signal may be more easily amplified, it has distinct drawbacks. The use of an alternating flux introduces spurious voltages that are unrelated to flow rate and, if untreated, give rise to inaccurate indications. The two spurious voltages that are most troublesome are stray capacitance-coupled voltages from the coil of the electromagnet to the electrodes, and induced loop voltages in the input leads. The electrodes and leads in combination with the liquid extending therebetween constitute a loop in which is induced a voltage from the changing flux of the magnetic coil.

The spurious voltages from the first source may be minimized by electrostatic shielding and by low-frequency excitation of the magnet to cause the impedance of the stray coupling capacitance to be large. But the spurious voltage from the second source is much more difficult to suppress.

The spurious voltage resulting from the flux coupling into the signal leads is usually referred to as the quadrature voltage, for it is assumed to be 90° out of phase with the A-C flow-induced voltage. Actual tests have indicated that this is not true in that a component exists in-phase with the flow induced voltage. Hence, that portion of the "quadrature voltage" that is in-phase with the flow-induced voltage signal constitutes an undesirable signal that cannot readily be distinguished from the flow-induced signal, thereby producing a changing zero shift effect.

Pure "quadrature" voltage has heretofore been minimized by an electronic arrangement adapted to buck out this component, but elimination of its in-phase component has not been successful. Existing A-C operated electromagnetic flowmeters are also known to vary their calibration as a function of temperature, fluid conductivity, pressure and other effects which can alter the spurious voltages both with respect to phase and magnitude. Hence it becomes necessary periodically to manually re-zero the meter to correct for the effects on zero by the above-described phenomena.

All of the adverse effects encountered in A-C operation of electromagnetic flowmeters can be attributed to the rate of change in the flux field $d\phi/dt$, serving to induce unwanted signals in the pick-up loop. If, therefore, the rate of change of the flux field could be reduced to zero value, then the magnitude of quadrature and of its in-phase component would become non-existent. Zero drift effects would disappear.

When the magnetic flux field is a steady state field, as, for example, with continuous d-c operation, the ideal condition $d\phi/dt=0$ is satisfied. But d-c operation to create a steady state field is not acceptable; for galvanic potentials are produced and polarization is encountered, as previously explained. In order, therefore, to obtain the positive benefits of a steady state field without the drawbacks which accompany continuous d-c operation, the U.S. Pat. No. 3,783,687 to Mannherz et al. (hereinafter referred to as the Mannherz patent) discloses an excitation arrangement in which the steady state flux field is periodically reversed or interrupted. The entire disclosure of this patent is incorporated herein by reference.

In the Mannherz patent, in order to avoid the spurious voltages which result from stray couplings without, however, causing polarization of the electrodes, the electromagnet is energized by a low-frequency square wave. This wave is produced by applying the output voltage of an unfiltered full-wave rectifier to the electromagnet and periodically interrupting this voltage at a low-frequency rate by means of an electronic switch.

The magnetic field produced by the square wave is disrupted by switching transients. In a flowmeter of the Mannherz type, the flow-induced signal derived from the electrodes is measured during a sampled portion of each "on" and each "off" condition of the magnetic field in the course of an excitation cycle to discriminate against the transients. The converter to which the signal from the electrodes is applied includes a synchronous demodulator which is gated synchronously to yield an output signal only when the magnetic flux achieves a steady state condition. Successive differences in this signal are taken as representative of flow rate.

When the Mannherz electromagnetic flowmeter is a component in an industrial process control loop, it becomes necessary to compare its flow rate indication in in electronic controller with a set point to provide an output which depends on the deviation of the flow rate from the set point, which output acts to govern the operation of a final control element, such as a valve, to change the flow rate in a direction and to an extent determined by the set point. For this purpose, it is useful to employ a digital computer as the electronic controller; for the computer is capable of conditioning the flowmeter signal and of serving in a multiplex arrangement in conjunction with a plurality of process control loops.

A digital computer is an instrument adapted to carry out arithmetic or logic operations on digital data entered into its input to yield numerical results or decisions. All digital computers, whether in large-scale general-purpose form or in microcomputer form, are essentially composed of a central processing unit, a memory system and input-output devices.

The task assigned to a central processing unit is to receive and to store digital data for later processing, to perform arithmetic or logic operations on this data in accordance with previously-stored instructions, and to deliver the results in the form of a digital output signal.

The central processing unit is that component of the computer which controls the interpretation and execution of instructions. A microprocessor is the central processing unit of a computer with its associated circuitry that is scaled down by integrated-circuit techniques to fit on one or more silicon chips containing thousands of transistors, resistors or other electronic circuit elements. By combining a microprocessor with other integrated circuit chips that provide timing, random access memory, interfaces for input and output signals and other ancillary functions, one can thereby assemble all of the necessary components of a microcomputer whose master component is the microprocessor.

In order to process the analog signal yielded by an electromagnetic flowmeter whose electromagnet is excited by a low frequency pulsatory current, such as a flowmeter of the type disclosed in the Mannherz patent, one must first convert this signal into a digital output representing instantaneous flow values. By digital processing, one is also able to eliminate or minimize the effect of noise components on the flow induced signal.

SUMMARY OF THE INVENTION

In view of the foregoing, the main object of this invention is to provide an analog-to-digital converter for an electromagnetic converter which makes use of low-frequency excitation and which produces an analog output in the form of a pulsatory wave, the amplitude of whose pulses represent a variable. While the invention will be described as it operates in conjunction with a flowmeter, it is to be understood that the analog-to-digital converter is also applicable to analog signals in pulsatory waveforms yielded by other instruments.

More particularly, it is an object of this invention to provide a digital representation of the instantaneous value of the electrode signal yielded by an electromagnetic flowmeter in a form which can be processed by an intelligent digital device such as a microprocessor.

Also an object of this invention is to provide an analog-to-digital converter in an electromagnetic flowmeter system which is of relatively simple and inexpensive design which operates efficiently and reliably, the converter acting to reject power line-related noise as well as high-frequency noise.

Briefly stated, these objects are accomplished in an analog-to-digital converter operating in conjuncion with an electromagnetic flowmeter whose electromagnet is supplied with an excitation current that is alternately turned "on" and "off" at a low frequency rate, the resultant flow-induced electrode signal being sampled for a predetermined interval in each "on" and "off" field state, successive differences therebetween serving to develop an analog signal representing the flow rate of the fluid being metered.

Conversion is effected by integrating each sample to produce a sloped voltage whose polarity corresponds to that of the sample and whose peak level relative to a base level is determined by the amplitude of the sample. The sloped voltage is then de-integrated back to base level in a time slot whose duration is directly proportional to the peak level of the sample; the higher this level, the wider the slot. A burst of pulses is extracted from a stable high-frequency oscillator during this time slot, the pulse count of the burst being determined by the duration of the slot, thereby converting each sample into a digital value.

OUTLINE OF DRAWINGS

For a better understanding of the invention as well as other objects and further features thereof, reference is made to the following detailed description to be read in conjunction with the accompanying drawings, wherein:

FIG. 1 is a schematic diagram of an electromagnetic flowmeter system which includes an analog-to-digital converter in accordance with the invention;

FIGS. 2A to F are waveforms representing the voltages developed at various terminals in the system;

FIG. 3 is a typical waveform of the voltage appearing at the output of the integrator in the converter, the waveform being correlated with the logic time pulses produced in the converter; and FIG. 4 is a timing diagram of the logic.

DESCRIPTION OF INVENTION

The System:

Referring now to FIG. 1, there is shown a flowmeter system in accordance with the invention, constituted by a primary in the form of an electromagnetic flowmeter adapted to produce a low-level analog signal output in accordance with the flow rate of the liquid being measured, and a secondary which converts this low level signal into a digital output representing instantaneous flow rate values, which digital output may be processed by an intelligent digital device such as a microprocessor.

The flowmeter primary includes a flow tube 10 through which is conducted the fluid to be metered. An electromagnet having a pair of coils 11 and 12 on either side of the flow tube is provided to establish a magnetic field which is transverse to the direction of flow. Electrodes 13 and 14 in contact with the flowing field are disposed at diametrically-opposed points on the flow tube on an axis which is perpendicular both to the longitudinal direction of flow and the transverse magnetic field. As is well known, a voltage is induced in the fluid whose flow intersects the magnetic field, this voltage being transferred to the electrodes to produce a signal at flowmeter output terminals that reflects the flow rate.

Electromagnetic coils 11 and 12 are connected in series and are excited by a relatively low-frequency square wave derived from a power supply including a full-wave rectifier bridge 15 whose input junctions are connected to a standard a-c power line through an electronic switch 16, the line supplying a-c current at 60 Hz (or 50 Hz). The output junctions of bridge 15 are connected to the coils of the electromagnet through a resistor 17 across which is developed a reference voltage that depends on the excitation current flowing therethrough, the reference voltage appearing at terminal R.

While switch 16 and all other switches shown in FIG. 1 are illustrated as mechanical devices, in practice these switches are in electronic form and may be constituted by triacs or any other electronic switching element in solid-state or vacuum tube form.

Switch 16 is activated at a rate which is a sub-multiple of the a-c line frequency. This is accomplished by a frequency divider included in a conversion and timing logic circuit TL which is coupled to the a-c line. The 60 Hz line voltage is applied to the divider as a clock signal which is shaped and scaled down to yield low frequency square wave gate pulses at terminal G at a repetition rate of, say 3.75 Hz. The waveform of gate pulses G is shown in FIG. 2A.

Electronic switch 16 periodically interrupts the flow of d-c excitation current to electromagnet coils 11 and 12 at the 3.75 Hz rate. The logic circuit of device TL also yields logic signals A, B, C and D which serves to activate the other switches of the analog-to-digital converter in a manner to be later described.

Thus the electromagnet is periodically driven "on" and "off" by gate pulses G and the output of rectifier bridge 15 applied to the electromagnet is unfiltered. Consequently, the reference voltage developed across resistor 17 which senses the excitation current, assumes at terminal R the waveform shown in FIG. 2B, where it will be seen that this voltage has a distinct ripple component.

The action of the magnetic field on the conductive fluid flowing through tube 10 which intercepts the "on" and "off" magnetic field produces a velocity-dependent voltage between electrodes 13 and 14. This fluid-induced electrode voltage appears at terminals $T_1$ and $T_2$, the waveform of this voltage being shown in FIG. 2C. Terminal $T_3$ common to terminals $T_1$ and $T_2$ is connected to ground, terminal $T_3$ being spaced by a distance at least equal to the diameter of tube 10 from the plane of the electrodes.

As in any electromagnetic flowmeter, the a-c voltage between the electrodes is directly proportional to both fluid velocity and magnetic flux density which in turn is directly related to the intensity of the excitation current. Since the reference voltage at terminal R is subject to change as a result of power line fluctuations as well as the effect of temperature on the resistance of the electromagnet, means must be provided to compensate for these changes in order to obtain accurate flow measurement.

The electrode signal at terminals $T_1$ and $T_2$ is applied to a high impedance a-c coupled amplifier represented by element 18 which incorporates means to adjust the gain to accommodate various full-scale velocity settings. The output of amplifier 18 is applied through an electronic switch 19 and a capacitor 20 to the non-inverting input of a differential amplifier 21 acting as a buffer. Amplifier 21, in turn, drives an integrating amplifier 22 provided with an R-C network formed by a resistor 23 and a capacitor 24.

The output of integrating amplifier 22 is applied to a high-gain amplifier 25 whose output is applied to one input of a comparator 26. The output of this comparator is fed as a control signal to timing logic TL. Associated with timing logic TL is a stable source of pulses having a high-frequency repetition rate, such as a crystal-controlled oscillator, represented by piezoelectric crystal Q.

The reference voltage from terminal R is applied through an R-C network formed by capacitor 27 and resistor 28 to reference amplifier 29. The output of amplifier 29 is applied through an electronic switch 30 and a resistor 31 to a feedback integrator 31 having an R-C network formed by capacitor 44 and resistor 31. The output of feedback integrator 32 is applied to a precision inverter 34.

Connected across feedback integrator 32 is an electronic switch 35. Connected between the output of inverter 34 and the output of feedback integrator 32 is an electronic switch 36 in series with an electronic switch 37, the junction of these switches being connected to one end of a voltage divider formed by resistor 38 in series with resistor 39, the other end of this divider being grounded.

The tap of this voltage divider is connected through an electronic switch 40 to the non-inverting input of buffer 21. The inverting input of buffer 21 is connected to the output of a "zero" amplifier 41 whose input is connected through an electronic switch 42 to the output of high-gain amplifier 25, a holding capacitor 43 being connected between the input of zero amplifier 44 and ground.

Logic signal A, when high, serves to simultaneously activate both switches 19 and 30. Logic signal B is the complement of logic signal A; and, when high, this signal serves to activate switch 40. Switch 36 is activated when logic signal C is high; switch 37 is activated when logic signal D is high; and switch 42 is activated when logic signal E is high.

Operation:

When electronic switch 19 interposed between electrode signal amplifier 18 and buffer amplifier 21 is activated by logic signal A from timing logic TL, the conditioned analog signal from amplifier 18 reches amplifier 21. This occurs only during an interval in which the electrode signal is in a steady state condition whereby transients present in the signal are discriminated against. In practice, this interval may be the last 25% of each half period of the excitation cycle whose duration is determined by gate signal G. Thus logic signal A is activated in the last 25% interval of the half periods produced by gate signal G.

In response to the resultant 25% interval sample, buffer amplifier 21 drives integrator 22 in the direction of the instantaneous input polarity, as indicated by the waveform diagram in FIG. 2D, which represents the form of voltage produced at output terminal Y of integrator 22. At the end of the sampling interval which is determined by logic signal A, switch 19 is deactivated to cut off the input to buffer 21, at which point switch 40 is then activated by logic signal B, the complement of logic signal A.

Activated switch 40 in combination with switch 36 or switch 37 activated by logic signals C and D, respectively, then applies a reference voltage to the non-inverting input of buffer 21 of the polarity required to bring the output of integrator 22 to zero. In other words, each sample integration interval is immediately followed by a de-integration phase.

High gain amplifier 25 applies the output of integrator 22 to comparator 26, which possesses a hysteresis characteristic to form an arrangement making it possible to precisely determine the point in time when the integrator output crosses zero. This information is supplied to the timing logic TL by comparator 26.

During the time slot when integrator 22 is being returned to zero, the high-frequency oscillator Q is gated in timing logic TL to extract therefrom a burst of pulses which appears at output terminal Z. The count of oscillator cycles or pulses in the burst is therefore directly proportional to the amplitude of the sample, as indicated in FIG. 2F. It will be seen in this figure that the successive output bursts at terminal Z lies within the time slots defined by the de-integration intervals. Thus the output is a continuous train of successive pulse bursts.

Also incorporated in the output are polarity-indicating pulses $P_1$, $P_2$, $P_3$, etc., which remain high during a portion of the gate half period if the preceding input polarity had been negative. Thus pulse $P_1$ in FIG. 2F appears subsequent to a negative-going slope voltage in the integration waveform in FIG. 2D. But the next slope voltage in this integration waveform is positive; hence there is no polarity-indicating pulse produced until pulse $P_2$ which is subsequent to the next negative-going sloped voltage.

The signal serving to return integrating amplifier 22 to its zero base line is derived from the reference voltage at terminal R which is decoupled by R-C network 27–28 and then amplified in amplifier 29. During the interval defined by logic signal A when the analog input signal is being integrated, because switch 19 is then activated, switch 30 is concurrently activated by signal A to permit simultaneous integration of the reference voltage by feedback integrator 32. At the completion of input signal integration, switch 30 is deactivated, allowing feedback integrator 32 to maintain its integrated value of reference voltage until integrating amplifier 22 has returned to zero. At that point, integration capacitor 44 connected across feedback integrator 32 is shorted by switch 35 which is activated by logic signal E. In this way, capacitor 44 is maintained in its discharged state until integration is again required.

The output of feedback integrator 32 is also precisely inverted by inverter 34 to permit application of the reference voltage in the polarity required to effect de-integration. The output waveform of the integrated feedback voltage appearing at terminal X at the output of integrator 32 is shown in FIG. 2E.

Also taking place during the interval defined by logic signal E which activates switch 42 is zero correction of the buffer amplifier 21 and integrating amplifier 22. When switch 42 is activated by logic signal E, capacitor 43 is then connected to the output of amplifier 25 and is charged to the output voltage thereof. This voltage value, buffered by zero amplifier 41, is fed back as a negative feedback voltage to the inverting terminal of buffer 21 for integrating amplifier 22 to drive the output of amplifier 25 toward zero.

When switch 42 is deactivated during signal voltage and reference voltage integration, the zero correction value placed in capacitor 43 will be held, thereby permitting more accurate measurement than would otherwise be possible, while providing a repeatable starting point for integration.

The relationships between logic signals A, B, C, D and E and the integrated and de-integrated voltage slopes are shown in FIGS. 3 and 4. It will be seen that the integration slope interval is defined by logic signal A, the de-integration slope by logic signal C or D, the interval between the conclusion of the de-integration slope and the initiation of the next integration action by logic signal E and the interval between the conclusion of one integration and the initiation of a next integration action by signal B.

In order to measure flow using this system, gate pulses G, which are also made available at output terminal $G_o$ of the timing logic TL and the pulse bursts yielded at output terminal Z are passed through optical interfaces or other isolation devices to a digital counter and processing circuit DC.

The instantaneous flow is the sum of the value counted while gate signal G was high and the inverse of the value counted while gate signal G was low. For example, a reading of +1000 for a high gate and that of −500 for a low gate results in a net flow of +1500; whereas a high gate value of −2000 and a low gate value of −750 gives a flow of −1250. Thus the flow metering system in accordance with the invention is inherently bi-directional.

Advantages:

A significant advantage of the above-described system is that it requires only two logic lines which may be easily isolated from the measurement to afford an a-c flow measurement reflecting the ratio of flow signal to reference signal. This technique is applicable to any a-c system where one seeks to obtain a precise ratio of signal-to-reference.

The simplicity of the system also reduces the complexity of the circuits required to further process the digital output using a microprocessor. One may apply averaging routines to noisy flow signals using a microprocessor of minimum complexity for this purpose.

In summary, therefore, an analog-to-digital converter in accordance with the invention makes it possible to attain the following advantages:

1. True integration of the flow input over a multiple of power line periods affords maximum rejection of power line-related noise as well as high frequency noise.

2. De-integration using a true flux-derived signal integrated over the same interval as the input makes possible accurate measurements.

3. Indication of the polarity state permits use under reverse flow conditions or conditions in which d-c transients are superimposed over the flow signal.

4. The output may readily be subjected to further digital signal processing without making the output rate of change excessively slow. In its simplest sense, flow output, will be the sum of two successive readings of opposite polarity.

While there has been shown and described a preferred embodiment of an analog-to-digital converter for electromagnetic flowmeter in accordance with the invention, it will be appreciated that many changes and modifications may be made therein without, however, departing from the essential spirit thereof.

Thus while the invention has been described in conjunction with a bipolar pulsatory excitation wave in a magnetic flowmeter in which the excitation current is alternately turned "on" and "off," the invention is also applicable to a pulsatory wave which is intermittently pulsed on positive and then on negative.

I claim:

1. In combination, an electromagnetic flowmeter in which a fluid being metered passes through a flow tube to intersect a magnetic field, the voltage induced in the fluid being transferred to a pair of electrodes, the electromagnet being supplied with excitation current that is alternatively turned "on" and "off" at a low frequency rate, the resultant flow-induced signal being sampled for a predetermined interval in each "on" and "off" field period to provide a continuous train of samples, successive differences between the samples serving to develop an analog signal representing the flow rate, a reference voltage being derived from said excitation current whose magnitude depends on said current and is therefore indicative of said interval; said excitation current being supplied by a full wave rectifier coupled to a standard a-c power line through an electronic switch activated at a rate which is a sub-multiple of the line frequency to produce a flow induced electrode signal in the alternate "on" and off periods; and an analog-to-digital converter comprising:

A. means to integrate each sample in the continuous train thereof during said interval to produce a sloped voltage extending from a base level to a peak level which depends on the amplitude of the sample and to then under the control of said reference voltage de-integrate the sample back to the base level in a time slot whose duration is directly proportional to the peak level; said integration and de-integration means including an integration amplifier, said electrode signal being applied to said amplifier through a second electronic switch which is activated during said predetermined interval in each of the alternate "on" and "off" periods whereby said amplifier integrates the resultant samples, the de-integration of said integration amplifier being controlled in accordance with said reference voltage;

B. a stable source of high-frequency pulses; and

C. means to extract a burst of pulses from said source during each time slot to produce a continuous train of pulse bursts, each of which has a count that depends on the duration of the related time slot, thereby providing the desired digital signal.

2. The combination as set forth in claim 1, wherein said reference voltage is applied to a feedback integrator through a third electronic switch operating in synchronism with said second switch to produce an integrated feedback voltage for de-integrating said integration amplifier.

* * * * *